United States Patent
Markham et al.

(10) Patent No.: US 9,754,704 B2
(45) Date of Patent: Sep. 5, 2017

(54) MAKING THIN-FILM MULTI-LAYER MICRO-WIRE STRUCTURE

(71) Applicants: Roger G. Markham, Webster, NY (US); Ronald Steven Cok, Rochester, NY (US); Yongcai Wang, Rochester, NY (US); Mitchell Lawrence Wright, Rochester, NY (US)

(72) Inventors: Roger G. Markham, Webster, NY (US); Ronald Steven Cok, Rochester, NY (US); Yongcai Wang, Rochester, NY (US); Mitchell Lawrence Wright, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 725 days.

(21) Appl. No.: 14/264,545

(22) Filed: Apr. 29, 2014

(65) Prior Publication Data

US 2015/0310963 A1    Oct. 29, 2015

(51) Int. Cl.
*H05K 3/46* (2006.01)
*H01B 1/02* (2006.01)
(Continued)

(52) U.S. Cl.
CPC .............. *H01B 19/04* (2013.01); *H01B 1/02* (2013.01); *H01B 1/22* (2013.01); *H05K 3/1258* (2013.01);
(Continued)

(58) Field of Classification Search
None
See application file for complete search history.

(56) References Cited

U.S. PATENT DOCUMENTS 5,169,680 A   12/1992  Ting et al.
8,179,381 B2   5/2012  Frey et al.
(Continued)

FOREIGN PATENT DOCUMENTS

CN       102063951          7/2013
WO       2011/066055        6/2011
WO       WO/2013/169345  *  11/2013

OTHER PUBLICATIONS

Langmuir 1996, 12, 1375-1380, Microcontact Printing of Palladium Colloids: Micron-Scale Patterning by Electroless Deposition of Copper, by P.C. Hidber et al.

(Continued)

*Primary Examiner* — Lisha Jiang
(74) *Attorney, Agent, or Firm* — Raymond L. Owens; Kevin E. Spaulding

(57) ABSTRACT

A method of making a thin-film multi-layer micro-wire structure includes providing a substrate and a layer on the substrate with one or more micro-channels having a width less than or equal to 20 microns. A conductive material including silver nano-particles and having a percent ratio of silver that is greater than or equal to 40% by weight is located in the micro-channels and cured to form an electrically conductive micro-wire. The electrically conductive micro-wire has a width less than or equal to 20 microns and a depth less than or equal to 20 microns. Each micro-wire is electrolessly plated to form a plated layer located at least partially within each micro-channel between the micro-wire and the layer surface in electrical contact with the micro-wire. The plated layer has a thickness less than a thickness of the micro-wire so that the micro-wire and plated layer form the thin-film multi-layer micro-wire.

23 Claims, 11 Drawing Sheets

(51) Int. Cl.
*H01B 5/02* (2006.01)
*H01B 19/04* (2006.01)
*H01B 1/22* (2006.01)
*H05K 3/12* (2006.01)
*H05K 1/09* (2006.01)
*H05K 3/24* (2006.01)

(52) U.S. Cl.
CPC ............ *H05K 1/097* (2013.01); *H05K 3/246* (2013.01); *H05K 2203/072* (2013.01)

(56) References Cited

U.S. PATENT DOCUMENTS

| | | | |
|---|---|---|---|
| 2006/0163744 A1* | 7/2006 | Vanheusden | B82Y 30/00 257/773 |
| 2010/0026664 A1 | 2/2010 | Geaghan | |
| 2010/0328248 A1 | 12/2010 | Mozdzyn | |
| 2011/0007011 A1 | 1/2011 | Mozdzyn | |
| 2011/0099805 A1 | 5/2011 | Lee | |
| 2011/0240350 A1* | 10/2011 | Meinder | B82Y 10/00 174/258 |
| 2013/0207911 A1* | 8/2013 | Barton | G06F 3/0488 345/173 |
| 2014/0116753 A1* | 5/2014 | Lee | H05K 1/09 174/250 |
| 2014/0124582 A1* | 5/2014 | Kroener | G06K 19/0723 235/487 |
| 2015/0125596 A1* | 5/2015 | Ramakrishnan | H01Q 7/00 427/125 |

OTHER PUBLICATIONS

Electroless Silver Plating of Screen Printed Front Grid Fingers as a tool for Enhancement of Solar Cell efficiency, E. Wefringhaus, et al.
Applied Physics Letters 88, 083110 (2006), Selective electroless plating to fabricate complex three-dimensional metallic micro-nanostructures, F. Formanek, et al.
Journal of the electrochemical society, 160 (12) D3237-D3246 (2013), Electroless Copper Deposition Using Sn/AG Catalyst on Epoxy Laminates, E. Uzunlar, et al.
Applied Physics Letters, vol. 80, No. 12, Mar. 25, 2002, Fabrication of palladium-based microelectronics devices by microcontact printing, D. Wolfe, et al.
Modern electroplating, Fifth Edition, Electroless Deposition of Copper, Milan Paunovic, (2010).
International Solar Energy Research Center Konstanz e.V, Electroless Silver Plating as a Tool for Enhancement of Efficiency of Standard Industrial Solar Cells, Dr. Eckard Wefringhaus.
Minipad Apr. 25-26, 2012, Chip Integration using inkjet-printed silver conductive tracks reinforced by electroless plating for flexible board packages, R. Cauchois.

* cited by examiner

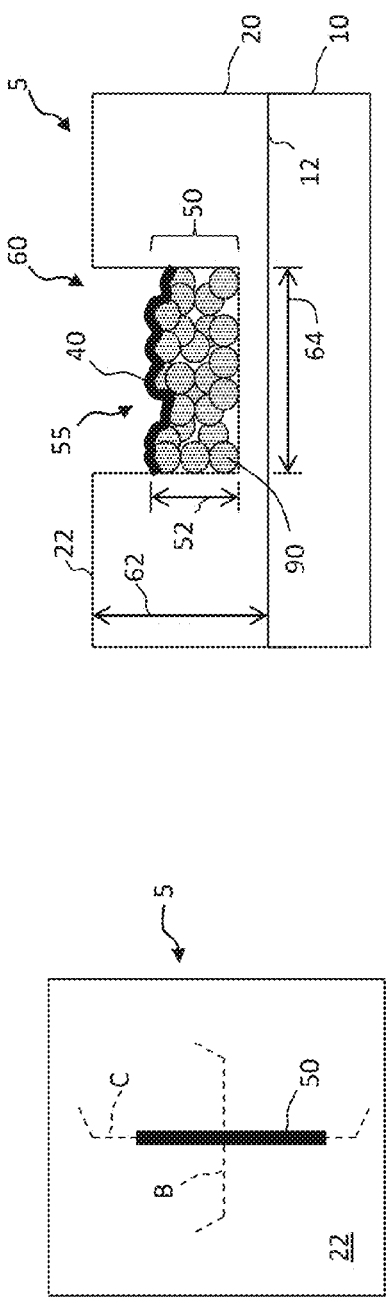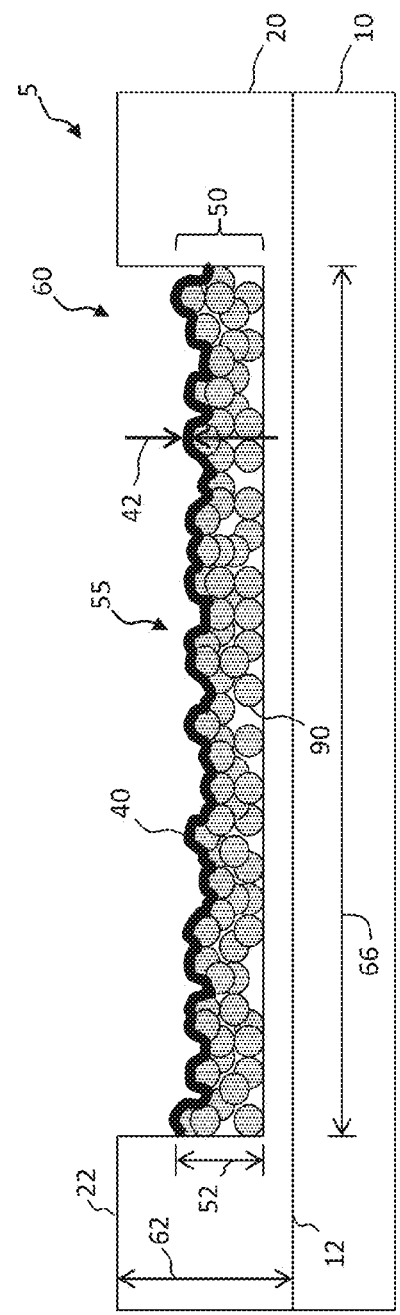

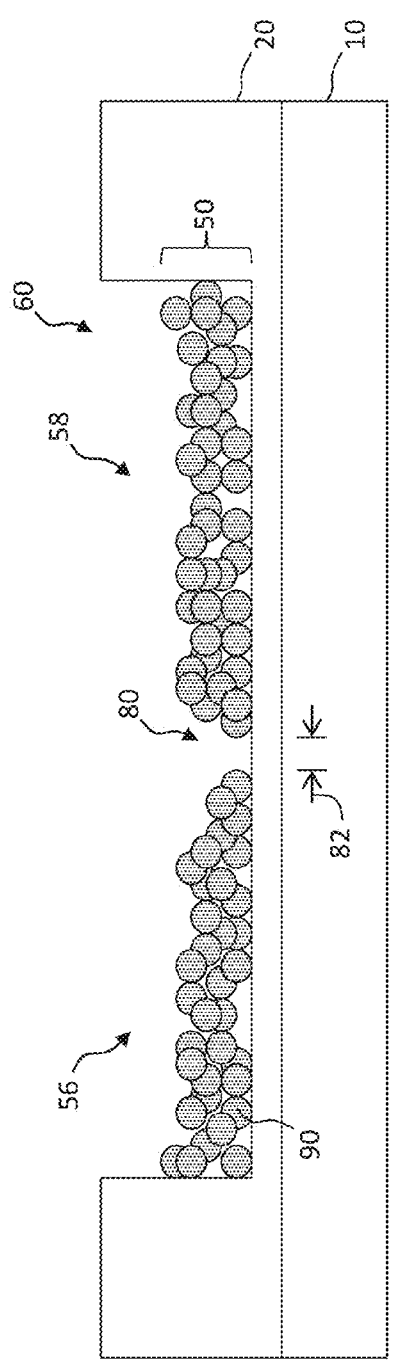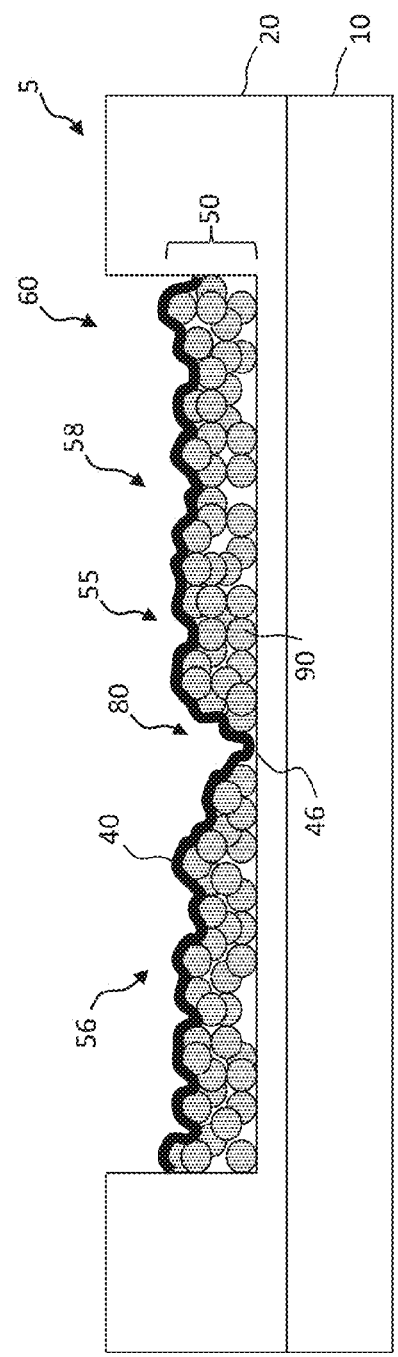

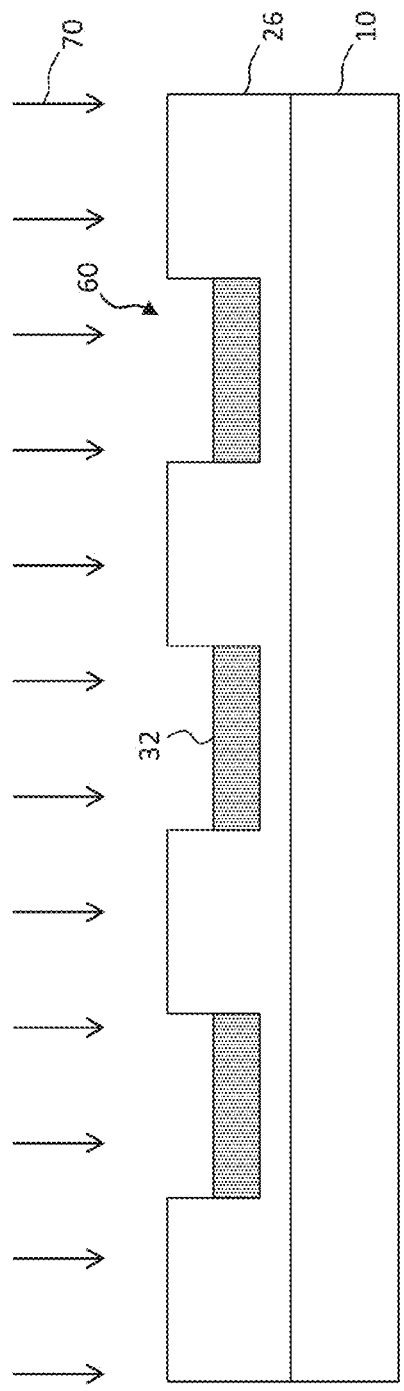
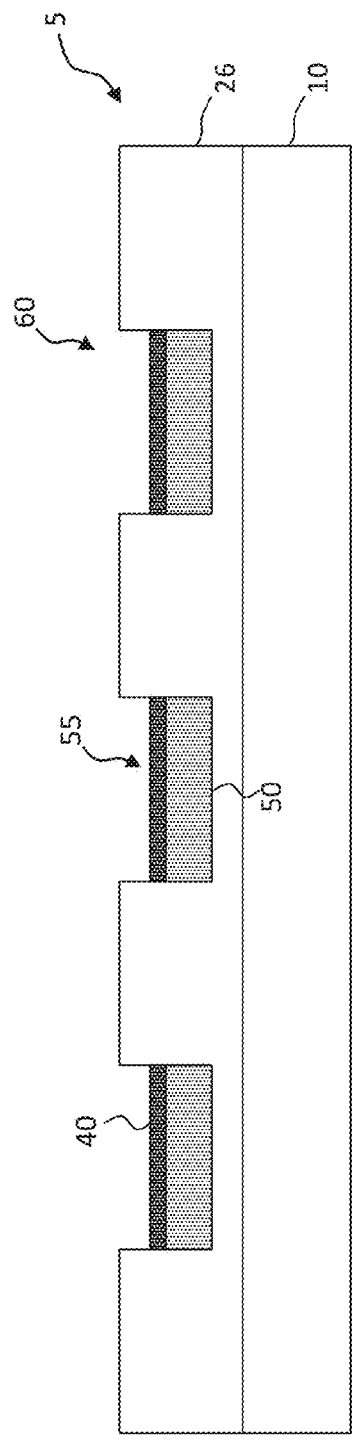

MAKING THIN-FILM MULTI-LAYER MICRO-WIRE STRUCTURE

CROSS REFERENCE TO RELATED APPLICATIONS

Reference is made to commonly-assigned U.S. patent application Ser. No. 14/264,499 (now U.S. Pat. No. 9,288, 901), entitled Thin-Film Multi-Layer Micro-Wire Structure, by Markham et al, and to commonly-assigned U.S. patent application Ser. No. 14/261,490 (now U.S. Pat. No. 9,296, 013), entitled Making Multi-Layer Micro-Wire Structure, by Spath et al, the disclosures of which are incorporated herein.

FIELD OF THE INVENTION

The present invention relates to electrically conductive multi-layer micro-wires formed within micro-channels on a substrate. One layer of the multi-layer micro-wire can include cured material and another layer is an electrolessly plated layer.

BACKGROUND OF THE INVENTION

Transparent conductors are widely used in the flat-panel display industry to form electrodes that are used to electrically switch light-emitting or light-transmitting properties of a display pixel, for example in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Transparent conductive metal oxides are well known in the display and touch-screen industries and have a number of disadvantages, including limited transparency and conductivity and a tendency to crack under mechanical or environmental stress. Typical prior-art conductive electrode materials include conductive metal oxides such as indium tin oxide (ITO) or very thin layers of metal, for example silver or aluminum or metal alloys including silver or aluminum. These materials are coated, for example, by sputtering or vapor deposition, and are patterned on display or touch-screen substrates, such as glass. For example, the use of transparent conductive oxides to form arrays of touch senses on one side of a substrate is taught in U.S. Patent Application Publication No. 2011/0099805 entitled "Method of Fabricating Capacitive Touch-Screen Panel".

Transparent conductive metal oxides are increasingly expensive and relatively costly to deposit and pattern. Moreover, the substrate materials are limited by the electrode material deposition process (such as sputtering) and the current-carrying capacity of such electrodes is limited, thereby limiting the amount of power that is supplied to the pixel elements and the size of touch screens that employ such electrodes. Although thicker layers of metal oxides or metals increase conductivity, they also reduce the transparency of the electrodes.

Apparently transparent electrodes including very fine patterns of conductive elements, such as metal wires or conductive traces are known. For example, U.S. Patent Application Publication No. 2011/0007011 teaches a capacitive touch screen with a mesh electrode, as do U.S. Patent Application Publication No. 2010/0026664, U.S. Patent Application Publication No. 2010/0328248, and U.S. Pat. No. 8,179,381, which are hereby incorporated in their entirety by reference. As disclosed in U.S. Pat. No. 8,179, 381, fine conductor patterns are made by one of several processes, including laser-cured masking, inkjet printing, gravure printing, micro-replication, and micro-contact printing. In particular, micro-replication is used to form micro-conductors formed in micro-replicated channels. The apparently transparent micro-wire electrodes include micro-wires between 0.5µ and 4µ wide and a transparency of between approximately 86% and 96%.

Conductive micro-wires formed in micro-channels embossed in a substrate, for example as taught in CN102063951, which is hereby incorporated by reference in its entirety. As discussed in CN102063951, a pattern of micro-channels are formed in a substrate using an embossing technique. Embossing methods are generally known in the prior art and typically include coating a curable liquid, such as a polymer, onto a rigid substrate. A pattern of micro-channels is embossed (impressed or imprinted) onto the polymer layer by a master having an inverted pattern of structures formed on its surface. The polymer is then cured. A conductive ink is coated over the substrate and into the micro-channels, the excess conductive ink between micro-channels is removed, for example by mechanical buffing, patterned chemical electrolysis, or patterned chemical corrosion. The conductive ink in the micro-channels is cured, for example by heating. In an alternative method described in CN102063951, a photosensitive layer, chemical plating, or sputtering is used to pattern conductors, for example using patterned radiation exposure or physical masks. Unwanted material (such as photosensitive resist) is removed, followed by electro-deposition of metallic ions in a bath.

In general, individual micro-wires are intended to be invisible to a user so that very narrow micro-wires are helpful. The micro-wires typically include metals that are not transparent but have a width of only a few microns, so that they are imperceptible to the unaided human eye. Because the micro-wires are so narrow, they have a tendency to break or crack.

Multi-layer conductive micro-wires are known in the art, for example co-pending U.S. patent application Ser. No. 13/779,917, filed Feb. 28, 2013 entitled Multi-Layer Micro-Wire Structure, by Yau et al and to commonly-assigned co-pending U.S. patent application Ser. No. 13/779,939, filed Feb. 28, 2013 entitled Making Multi-Layer Micro-Wire Structure, by Yau et al; the disclosures of which are incorporated herein.

Thick films of conductive material are used to form conductors on substrates, for example for printed circuit boards using etching or screen printing. These methods generally do not form very thin and very narrow conductors that are invisible to a viewer or that are constrained to a limited area on a substrate.

Electro-plating methods are also known to form conductors. In particular, electroless plating techniques rely on an autocatalytic process that deposits metals on a seed layer from a solution in which the seed layer is immersed. Such seed layers are typically very thin (only a few microns thick) and are not substantially electrically conductive. The metal deposited on the seed layer is relatively thick compared to the seed layer and much more electrically conductive. However, the time required to plate a sufficiently electrically conductive thick metal layer on a seed layer is often quite long, for example 20 or 30 minutes. This length of time is problematic in a commercial, high-volume manufacturing process. Furthermore, the process of plating increases the substrate area rendered opaque by the seed layer and plated layer, rendering the layers more visible. Thus, it is difficult to form very narrow, very long, and very conductive micro-wires in a high-volume manufacturing process using such methods.

SUMMARY OF THE INVENTION

There remains a need for further improvements in structures and methods for providing electrically conductive micro-wires that are very long or very narrow.

In accordance with the present invention, a method of making a thin-film multi-layer micro-wire structure comprises:

providing a substrate having a substrate surface;

providing a layer on the substrate surface or as part of the substrate, the layer having a layer surface and one or more micro-channels formed in the layer, each micro-channel having a width less than or equal to 20 microns; coating a conductive material over the layer surface and in the micro-channels, the conductive material including silver nano-particles and having a percent ratio of silver that is greater than or equal to 40% by weight;

removing the coated conductive material from the layer surface but not the micro-channels;

curing the conductive material in the micro-channels to form an electrically conductive micro-wire located only within each micro-channel, the electrically conductive micro-wire having a width less than or equal to 20 microns and a depth less than or equal to 20 microns and;

electrolessly plating each micro-wire to form a plated layer located at least partially within each micro-channel between the micro-wire and the layer surface in electrical contact with the micro-wire, the plated layer having a thickness less than a thickness of the micro-wire so that the micro-wire and plated layer form the thin-film multi-layer micro-wire.

The present invention provides a thin-film multi-layer micro-wire structure having improved conductivity, flexibility, reduced breaks, reduced performance variability, and reduced manufacturing costs.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIGS. 1A, 1B, and 1C are a plan view, a cross section in one direction, and a cross section in another direction, respectively, of an embodiment of the present invention:

FIG. 2 is a cross section illustrating a micro-wire having micro-wire segments separated by a micro-gap useful in understanding the present invention;

FIG. 3 is a cross section according to another embodiment of the present invention;

FIGS. 6-12 are cross sections illustrating successive steps in a method of the present invention.

Figure 4:
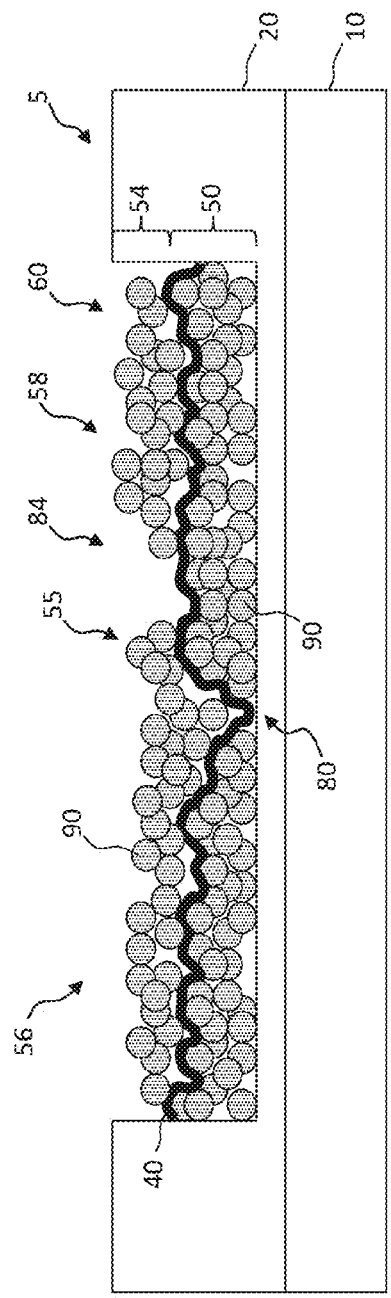
FIG. 4 is a cross section of an embodiment of the present invention having multiple micro-wires.

The Figures are not drawn to scale since the variation in size of various elements in the Figures is too great to permit depiction to scale.

DETAILED DESCRIPTION OF THE INVENTION

The present invention provides a thin-film multi-layer micro-wire structure having improved conductivity, flexibility, reduced breaks, and reduced manufacturing costs. The thin-film multi-layer micro-wire structure includes a cured electrically conductive micro-wire located only within each of one or more micro-channels formed in a substrate or layer. The micro-wire has a thickness less than or equal to 20 microns, includes silver nano-particles, and has a percent ratio of silver that is greater than or equal to 40% by weight. An electrolessly plated layer is located within each micro-channel between the micro-wire and a surface of the substrate or layer and is in electrical contact with the micro-wire. The plated layer has a thickness less than a micro-wire thickness. The micro-wire and plated layer form the thin-film multi-layer micro-wire.

FIGS. 1A, 1B, and 1C illustrate an embodiment of the present invention in which FIG. 1A is a plan view. FIG. 1B is a cross section of FIG. 1A taken along cross section line B and FIG. 1C is a cross section of FIG. 1A taken along cross section line C. Referring to FIGS. 1A, 1B, and 1C together, a thin-film multi-layer micro-wire structure 5 in an embodiment of the present invention includes a layer 20 having a layer surface 22 located on a substrate surface 12 of a substrate 10. The layer 20 can be a cured layer, for example cured by heat or radiation such as ultraviolet radiation, which is coated or otherwise deposited on the substrate 10 by coating methods known in the art, for example spin, hopper, or slot coating. Cured layers can include cross-linked materials such as are found, for example, in curable resins such as SU8.

The layer 20 includes one or more micro-channels 60 having a micro-channel depth 62, a micro-channel width 64, and a micro-channel length 66. In an embodiment, the layer 20 is first formed as a curable layer, exposed through a mask to form a cured pattern in the curable layer, and etched to form the micro-channels 60 in the layer 20. Curable layer materials, masks, exposure patterning through a mask, and etching methods are known in the art. In another embodiment, the layer 20 is first formed as a curable layer, imprinted with a stamp, and then cured to form a cured layer that is layer 20 having the micro-channels 60. Curable materials, imprinting stamps, and curing methods are also known in the art.

In an embodiment, the layer 20 is the substrate 10 of the substrate 10 or includes the layer 20 so that the substrate surface 12 and the layer surface 22 are the same surface. Alternatively, as illustrated, the layer 20 is located on the substrate surface 12 and the layer surface 22 is a surface of the layer 20 on a side of the layer 20 opposite the substrate surface 12. The present invention is not limited by a distinction between the substrate 10 and the layer 20 located on the substrate 10 or the layer 20 that is a part of the substrate 10 nor is the present invention limited by a distinction between the substrate surface 12 and the layer surface 22. In various embodiments, the substrate surface 12 and the layer surface 22 are the same surface or different surfaces and the layer 20 is the substrate 10 or a layer located on a substrate 10. In an embodiment in which the layer 20 is not the substrate 10, the layer surface 22 is on a side of the layer 20 opposite the substrate surface 12. The micro-channels 60 are formed in the layer 20 and form a discontinuity in the layer surface 22.

The micro-channels 60 each include a micro-wire 50 having a micro-wire thickness 52 less than or equal to 20 microns. In various embodiments, the micro-wire thickness 52 is the average thickness of the micro-wire 50 or the maximum thickness of the micro-wire 50. The micro-wire 50 includes silver nano-particles 90 that are agglomerated, sintered, welded, soldered, or otherwise electrically connected to form the electrically conductive micro-wire 50. The silver nano-particles 90 are regularly or randomly arranged in the micro-channel 60 and therefore the micro-wire 50 can have a variable micro-wire thickness 52 along the micro-channel length 66 as well as a variable micro-wire thickness 52 across the micro-channel width 64. The micro-wires 50 have a percent ratio of silver that is greater than or equal to 40% by weight.

In an embodiment, the silver nano-particles 90 are provided in an aqueous dispersion, in a liquid such as a solvent, or as a dry mixture and located in the micro-channels 60, for example by coating the substrate surface 12 and the micro-channels 60 (e.g. by spray or surface coating using methods known in the art) and then removed from the substrate surface 12 (for example by scraping or wiping the substrate surface 12), leaving the silver nano-particles 90 in the micro-channels 60 only. The dispersion can include other conductive or non-conductive materials, such as surfactants, anti-coagulants, anti-flocculants or other materials to improve the coatability of the liquid dispersion or dry materials. Once the silver nano-particles 90 are only located in the micro-channels 60, the dispersion is cured, for example with heat or evaporation to form a cured electrically conductive micro-wire having sintered or welded particles 90 that is the micro-wire 50. In an embodiment, other additional steps are employed to improve the electrical, optical or mechanical properties of the micro-wires 50, for example exposure to a hydrochloric vapor. The micro-wires 50 of the present invention have a percent ratio of silver that is greater than or equal to 40% by weight after curing, drying, or other processing steps that render the silver nano-particle 90 dispersion electrically conductive. In other embodiments, the micro-wire 50 is equal to or greater than 50%, 60%, 70%, 80%, or 90% silver by weight.

An electrolessly plated layer 40 is located at least partially within each micro-channel 60 between the micro-wire 50 and the layer surface 22. In one embodiment, the plated layer 40 extends above the layer surface 22 or beyond the walls of the micro-channel 60. In another embodiment, the electroless plating is within the micro-channel 60 only and the plated layer 40 is located within each micro-channel 60 only so that the plated layer 40 does not extend to the layer surface 22 or beyond the wall of the micro-channel 60. The electrolessly plated layer 40 is in electrical contact with the micro-wire 50 and has a plated layer thickness 42 less than a thickness of the micro-wire 50. In various embodiments, the plated layer thickness 42 is the average thickness of the plated layer 40, the maximum thickness of the plated layer 40, or the minimum thickness of the plated layer 40. In other embodiments, the electrolessly plated layer 40 is a metal layer, includes metal, is a metal alloy, or includes silver, copper, nickel, or tin. The micro-wire 50 and the plated layer 40 form a thin-film multi-layer micro-wire 55.

Electroless plating is an autocatalytic process that deposits conductive material on a seed layer. In the present invention, the micro-wires 50 provide the seed layer and the electrolessly plated layer 40 is formed by placing the micro-wires 50 in the micro-channels 60 in a suitable liquid, for example by coating or submersion.

In various embodiments, the micro-wire 50 has a micro-wire width of twenty microns, ten microns, five microns, two microns, or one micron or less but greater than zero microns, a micro-wire depth (thickness) greater than or less than twenty microns, ten microns, five microns, two microns, or one micron but greater than zero microns, and micro-wire lengths greater than or equal to 1 cm, 2 cm, 5 cm, 10 cm, 25 cm, 50 cm, 100 cm, 1 m, 2 m, 5 m, 10 m, or more. The plated layers 40 useful in the present invention can have a thickness less than or equal to ten microns, five microns, four microns, two microns, one micron, one-half micron, or one-tenth micron but greater than zero microns and less than the micro-wire thickness. In other embodiments, the plated layer 40 has a thickness less than one half, one quarter, or one tenth of the thickness of the micro-wire 50. Since the plated layer 40 is thinner than the micro-wire 50, it can also have a conductivity that is less than the conductivity of the micro-wire 50 so that, in another embodiment, the plated layer 40 has an electrical conductivity that is less than or equal to one half, one quarter, or one tenth of the electrical conductivity of the micro-wire 50.

In general, electroless plating processes are known. In an embodiment of the present invention, a useful autocatalytic process for forming the electrolessly plated layer 40 of the present invention includes a solution that includes metal or metal alloys. The conductive micro-wire 50 is exposed to electroless plating at a plating station after the micro-wires 50 are formed. The plating station can comprise a tank that contains copper in a liquid state at a temperature range between 20 and 90° C. Alternatively, the conductive material can comprise at least one of silver (Ag), gold (Au), nickel (Ni), tin (Sn), and palladium (Pd), aluminum (Al), zinc (Zn), or combinations or alloys thereof. In an embodiment, the deposition rate is about 10 nanometers or more per minute (nm/min) and the plating station deposits the conductive material to a thickness of about 0.001 micrometer to about 6 micrometers according to the application. This electroless plating process does not require the application of an electrical current and it only plates the patterned areas containing the conductive micro-wires 50.

The plating thickness resulting from electroless plating is more uniform compared to electroplating due to the absence of electric fields. Although electroless plating is more time consuming than electrolytic plating, electroless plating is well suited for the many fine features that are present in a high-resolution conducting pattern of micro-wires 50. After metal plating, the plated layer 40 is rinsed with water to remove any residual plating solution and dried.

The present invention provides a thin-film multi-layer micro-wire 55 having improved conductivity, manufacturability, and electrical and mechanical robustness over electrolessly plated seed layers of the prior art. Typical prior-art seed layers are thin compared to the plated layers and therefore have limited electrical conductivity. Moreover, because plated layers found in the prior art are thick compared to the seed layers, the plated layers take a long time to plate, for example 20 or 30 minutes or longer. Such lengthy plating times are problematic for manufacturing processes, in particular for roll-to-roll processes. By providing the silver nano-particle micro-wire 50 that is thicker than the plated layer 40 according to embodiments of the present invention, a highly conductive thin-film multi-layer micro-wire 55 is formed that requires relatively little plating time and yet provides improved electrical conductivity and robustness, as is discussed further below.

Seed layers of the prior art have a relatively low percent ratio of metal, such as silver or palladium, for example less than 5%-25% by weight, compared to the micro-wires 50 of the present invention. Thus, the seed layers of the prior art have relatively poor electrical conductivity, especially compared to the micro-wires 50 in the present invention.

The present invention is useful for forming thin-film electrical conductors that are difficult to see with the unaided human visual system and therefore in some embodiments arrangements of the thin-film multi-layer micro-wires 55 of the present invention are apparently transparent. Not only are the thin-film multi-layer micro-wires 55 less than or equal to 20 microns thick, they are also located within the micro-channels 60 and are therefore limited in their width by the micro-channel width 64 to a width that is less than or equal to 20 microns. In other embodiments, the micro-channels 60 and the thin-film multi-layer micro-wires 55 of the present invention are less than or equal to 15 microns wide, less than or equal to 10 microns wide, less than or equal to 5 microns wide, less than or equal to 2 microns wide, or less than or equal to 1 micron wide and are therefore not directly perceptible by the unaided human visual system.

In contrast to the thin-film electrical conductors of the present invention, thick-film conductors of the prior art, for example formed by processes such as screen printing silver paste, are not formed within the micro-channels 60 and are not limited in their width to widths that are directly visible to the unaided human visual system. As is known in the art, plating processes tend to increase the width of a seed layer, making them more visible. Prior-art experiments have demonstrated for example wire widths that increase by 5 microns or more on each side of the wire, depending on the length of time that a plating process proceeds. Since many prior-art plating processes rely on lengthy plating times to form sufficiently conductive plated layers, the more conductive a plated wire is, the wider the plated wire becomes. By employing the micro-channels 60 that constrain the width of the thin-film multi-layer micro-wires 55 of the present invention, electroless plating processes useful in the present invention do not increase the width of thin-film multi-layer micro-wires 55 and therefore maintain the apparent invisibility of the thin-film multi-layer micro-wires 55.

Thus thick-film conductors, whether plated or not, are relatively visible and are therefore not useful in applications requiring visual transparency or imperceptibility. Such applications, such as are found in the visible areas of a display, for example with the transparent electrodes of a touch screen or EMI shields are therefore suitable applications for the thin-film multi-layer micro-wires 55 of the present invention but are not suitable applications for prior-art thick-film conductors, whether plated or not. Furthermore, the use of the micro-channels 60 to constrain the thin-film multi-layer micro-wires 55 increases the mechanical robustness of the thin-film multi-layer micro-wire structure 5 by inhibiting the removal of the thin-film multi-layer micro-wires 55 from the substrate 10 or the layer 20, for example by scratching or scraping the substrate 10 or the layer 20 or even by thermally cycling the thin-film multi-layer micro-wire structure 5. Thus, additional materials such as ultraviolet-curable adhesives that can inhibit the conductivity of the thin-film multi-layer micro-wires 55 are not necessary in embodiments of the present invention.

In a further embodiment of the present invention, the micro-wire 50 includes a relatively small ratio of copper to silver, for example 5%. Copper is frequently used in relatively high proportions in prior-art plated seed layers, for example in ratios as high as 90% copper to silver. Since copper is more oxidative than silver, a higher percentage of copper will oxidize the seed or plated layer more readily, thereby reducing conductivity, changing color, and causing other undesirable changes in the plated wires. Hence, according to a further embodiment of the present invention, the thin-film multi-layer micro-wires 50 or thin-film multi-layer micro-wires 55 of the present invention include a ratio of silver to copper that is less than or equal to 50%, less than or equal to 40%, less than or equal to 30%, less than or equal to 20%, less than or equal to 10%, less than or equal to 5%, less than or equal to 2%, or less than or equal to 1%. In another embodiment, the micro-wire 50 is more than 50% silver by weight, more than 60%/o silver by weight, more than 70% silver by weight, more than 80% silver by weight, more than 90% silver by weight, or more than 95% silver by weight.

In an alternative embodiment, the plated layer 40 includes copper and the ratio of copper to silver in the plated layer 40 or the thin-film multi-layer micro-wire 55 is less than 50%.

Referring next to FIG. 2, it has been demonstrated that long micro-wires 50 formed in micro-channels 60 in the layer 20 on the substrate 10 can include micro-gaps 80 that form an electrical open between segments of the micro-wire 50, for example a first micro-wire segment 56 and a second micro-wire segment 58. The micro-gaps 80 have a micro-gap length 82. In another embodiment, the micro-gaps 80 are areas in the micro-wire 50 having fewer silver nano-particles 90 than in the rest of the micro-wire 50 so that an area of relatively higher electrical resistance is formed in the micro-gap 80 between the first and second micro-wire segments 56, 58. Thus, a micro-gap 80 in a micro-wire 50 is a portion of the micro-wire 50 that is an area of decreased electrical conductivity or an area of no electrical conductivity at all. The micro-gaps 80 can have a micro-gap length 82 that is less than or equal to the micro-channel width 64. In other embodiments, the micro-gap length 82 is less than ten microns, less than five microns, less than two microns, less than one micron, less than 500 nm, or less than 100 nm, but greater than zero nm.

Turning to FIG. 3, the thin-film multi-layer micro-wire structure 5 in an embodiment of the present invention includes the plated layer 40 on the micro-wire 50 in the micro-channel 60, forming the electrically conductive thin-film multi-layer micro-wire 55 in the layer 20 on the substrate 10. The plated layer 40 is located on the particles 90 of the micro-wire 50 and in the micro-gap 80 so as to form a continuous plated layer 40 on the micro-wire 50 that electrically connects the first and second micro-wire segments 56, 58. Thus, the plated layer 40 forms a plated conductive bridge 46 that electrically bridges the micro-gaps 80 between the first and second micro-wire segments 56, 58 and provides a more highly conductive thin-film multi-layer micro-wire 55 in the presence of the micro-gaps 80 and reduces variability of the electrical conductivity of the thin-film multi-layer micro-wire 55. Such variability is measured in various ways known in the statistical arts, for example using variance. In an embodiment, the conductivity variability of the thin-film multi-layer micro-wire 55 is less than the conductivity variability of the micro-wire 50. Furthermore, the plated layer 40 can provide additional robustness if the thin-film multi-layer micro-wire structure 5 is mechanically flexed by electrically bridging any new micro-gaps 80 that are formed in the micro-wire 50 after the micro-wire 50 is formed.

The micro-gaps 80 can arise for a variety of reasons. In an embodiment, the micro-gaps 80 are micro-cracks in the micro-wire 50. In another embodiment, air bubbles form in the dispersion and prevent a continuous coating of the silver nano-particles 90 in the micro-channel 60. Alternatively, the dispersion of the silver nano-particles 90 does not wick along the entire micro-channel length 66 and fails to coat the entire micro-channel 60, for example because of the surface energy of the bottom or sides of the micro-channel 60 and the dispersion attributes. In yet another instance, the drying process for the dispersion causes the area covered by the dispersion to shrink, reducing the potential size of the micro-wire 50 and forming the micro-gaps 80. These problems are mitigated somewhat by a careful selection of materials and processes. In a useful embodiment, the layer surface 22 has a surface energy of 50 dynes/cm or greater or a water contact angle of greater than 60 degrees. In another embodiment, the micro-channel 60 includes micro-channel surfaces that have the same surface energy as the layer surface 22.

Micro-gaps 80 in a single micro-wire 50 are particularly prevalent when the micro-wire 50 is extremely long, for example having a length of ten cm or greater, one hundred cm or greater, or 1 meter or greater. The micro-wire 50 can have a length to width ratio of one million or more, for example for a one-meter-long one-micron-wide micro-wire. Similarly, the micro-wire 50 can have a length to depth (thickness) ratio of one million or more, for example for a one-meter long one-micron deep micro-wire. Experiments have demonstrated that long micro-wires 50 can have a manufacturing yield of only 5% but that the thin-film multi-layer micro-wires 55 of the present invention can have a yield of 95% or greater, when using otherwise similar processes, materials, and methods. Thus, the present invention is useful in structures requiring very long single thin-film multi-layer micro-wires or in structures requiring multiple thin-film multi-layer micro-wires where high yields are essential to application success, for example when only two electrically connected thin-film multi-layer micro-wires 55 are used to form a single electrode or bus wire. Therefore, in an embodiment of the present invention, the thin-film multi-layer micro-wire 55 is a first thin-film multi-layer micro-wire 55 and the thin-film multi-layer micro-wire structure 5 further includes a second thin-film multi-layer micro-wire 55 electrically connected to the first thin-film multi-layer micro-wire 55. The first and second thin-film multi-layer micro-wires 55 form an electrical conductor that does not electrically connect to a third thin-film multi-layer micro-wire 55 for a distance of at least 1 cm, 10 cm, or 100 cm over the substrate 10.

Referring next to FIG. 4, in a further embodiment of the thin-film multi-layer micro-wire structure 5 of the present invention, a cured material 54 is located in each micro-channel 60 in the layer 20 on the substrate 10. The cured material 54 is in contact with the plated layer 40 on a side of the plated layer 40 opposite the micro-wire 50. The cured material 54, the plated layer 40, and the thin-film multi-layer micro-wire 55 form a thin-film multi-layer micro-wire 55 in the micro-channel 60 formed in the layer 20 on the substrate 10. In one embodiment of the present invention, the cured material 54 is light absorbing, for example including carbon.

In another embodiment, the cured material 54 includes the particles 90, for example silver nano-particles 90, forms a second micro-wire 50, and has a percent ratio of silver that is greater than or equal to 40% by weight.

In a further embodiment, the cured material 54 is the same material as the material forming the micro-wire 50 or is deposited and cured in a similar fashion as the micro-wire 50. In an embodiment, the cured material 54 forms an electrical conductor. Thus, in such an embodiment the micro-wire 50 is a first micro-wire 50 and the electrolessly plated layer 40 is a first plated layer. The cured material 54 is a cured electrically conductive second micro-wire 54 in electrical contact with the first plated layer 40.

Figure 5:
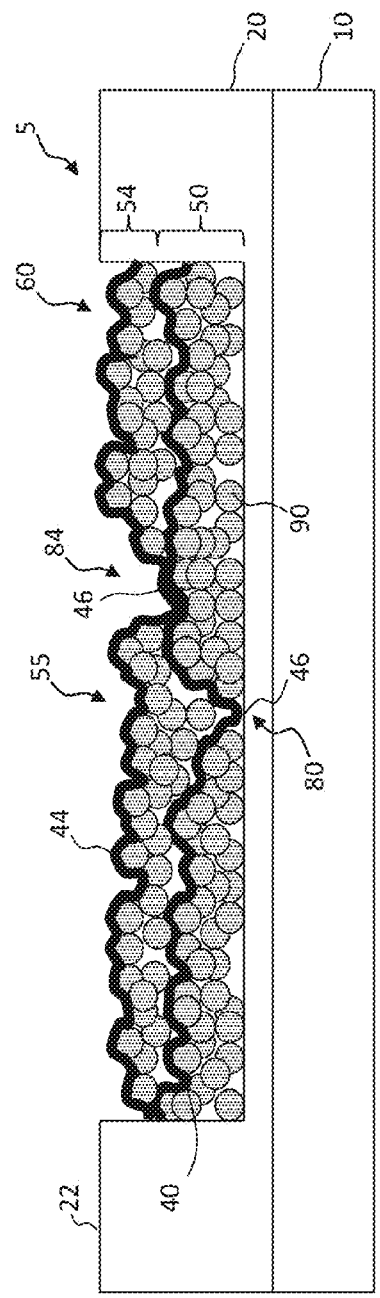
FIG. 5 is a cross section of an embodiment of the present invention having multiple micro-wires and multiple plating layers.
Figure 6:
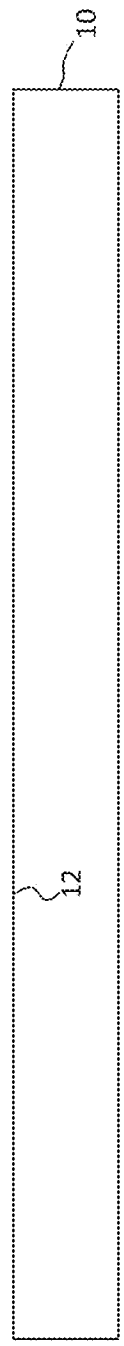
Figure 7:
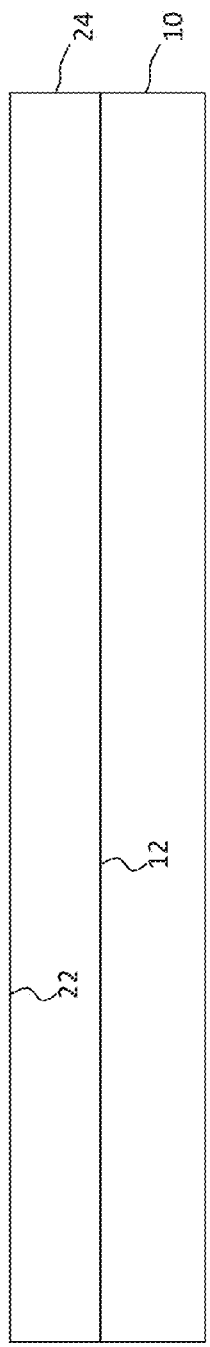

As noted above, the micro-wire 50 can include micro-gaps 80 separating the first and second micro-wire segments 56, 58 that are electrically bridged by the plated layer 40. Similarly, the second micro-wire 54 can include second micro-gaps 84 forming the first and second micro-wire segments 56, 58 in the second micro-wire 54. These are also electrically bridged by the plated layer 40. However, according to an additional embodiment of the present invention, the thin-film multi-layer micro-wire structure 5 illustrated in FIG. 5, further includes an electrolessly plated second plated layer 44 located at least partially within each micro-channel 60 in the layer 20 on the substrate 10 between the second micro-wire 54 and the layer surface 22 and in electrical contact with the second micro-wire 54. The second plated layer 44 has a thickness less than a thickness of the second micro-wire 54 so that the first and second micro-wires 50, 54 and the first and second plated layers 40, 44 form the thin-film multi-layer micro-wire 55. The second plated layer 44 forms a plated conductive bridge 46 that electrically bridges the second micro-gap 84 formed in the second micro-wire 54 just as the first plated layer 40 forms plated conductive bridges 46 that electrically bridge the micro-gaps 80 formed in the first micro-wire 50. In such an embodiment, the plated conductive bridge 46 that electrically bridges the second micro-gap 84 in the second micro-wire 54 is as thick as the first and second plated layers 40, 44 combined. In FIG. 5, the first and second micro-wires 50, 54 and the first and second plated layers 40, 44 form the thin-film multi-layer micro-wire 55.

According to a further embodiment of the present invention and as illustrated in FIGS. 4 and 5, the micro-gaps 80 in the first micro-wires 50 and the second micro-gaps 84 in the second micro-wires 54 have different locations in the micro-channels 60. Because the micro-channel 60 and the plated layer 40 are likely to have different surface energies and material properties, and because the formation of first and second micro-gaps 80, 84 tend to be uncontrolled or random, the first and second micro-gaps 80 and 84 are likely to occur in different locations. Thus, variability in the conductivity of the first and second micro-wires 50, 54 is reduced by the first and second plated layers 40, 44. Therefore, according to an embodiment of the present invention, each first micro-wire 50 includes first and second micro-wire segments 56, 58 having electrically open first micro-gaps 80 between the first and second micro-wire segments 56, 58 in first locations within the micro-channel 60 and each second micro-wire 54 includes first and second micro-wire segments 56, 58 separated by the electrically open second micro-gaps 84 between the first and second micro-wire segments 56, 58 in second locations within the micro-channel 60 that are different from the first locations.

Figure 8:
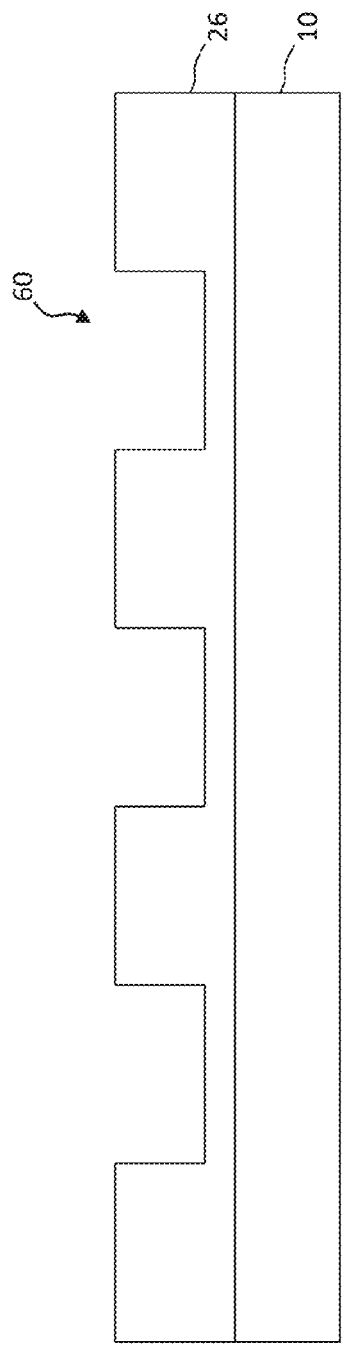
Figure 9:
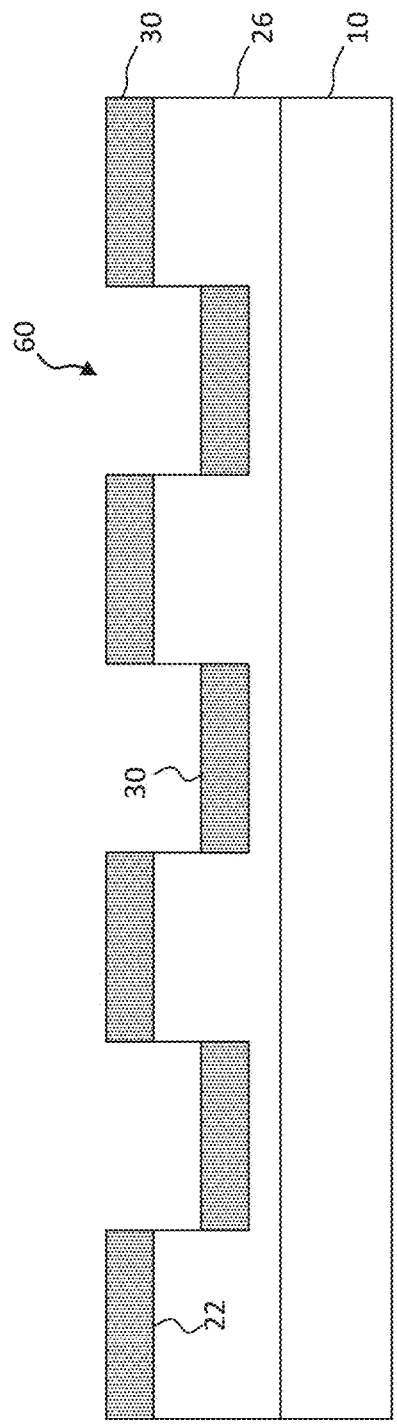
Figure 10:
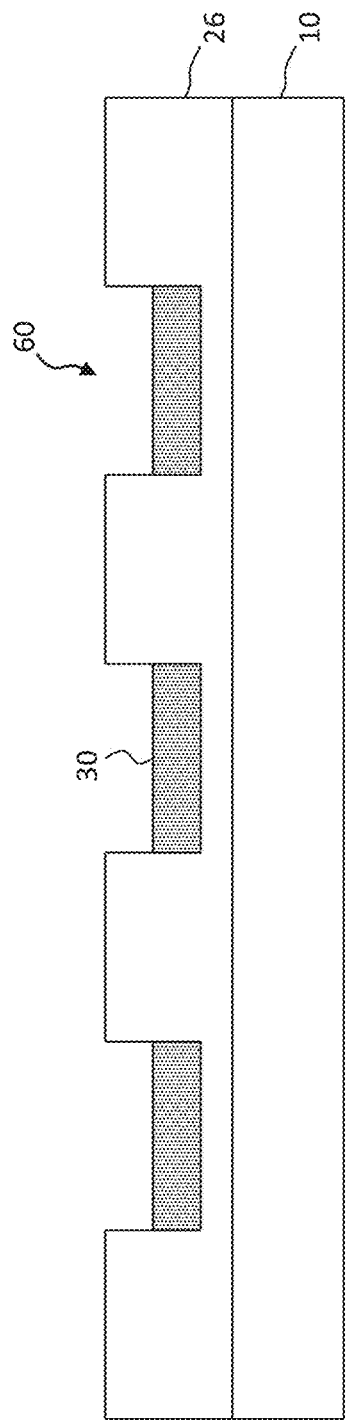
Figure 14:
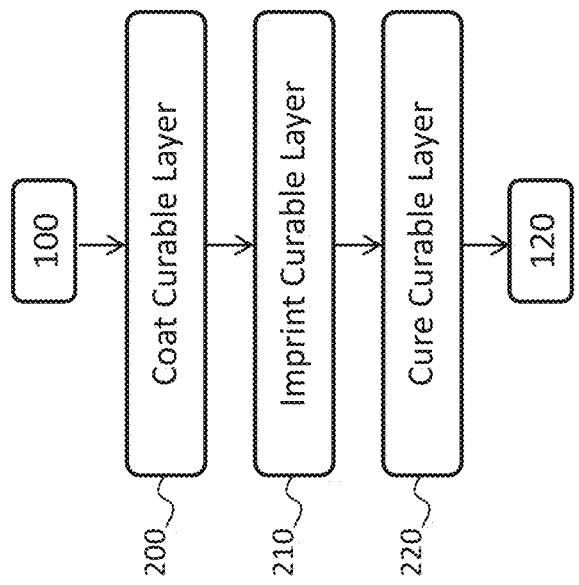
FIGS. 13-14 are flow diagrams illustrating methods of the present invention.
Figure 13:
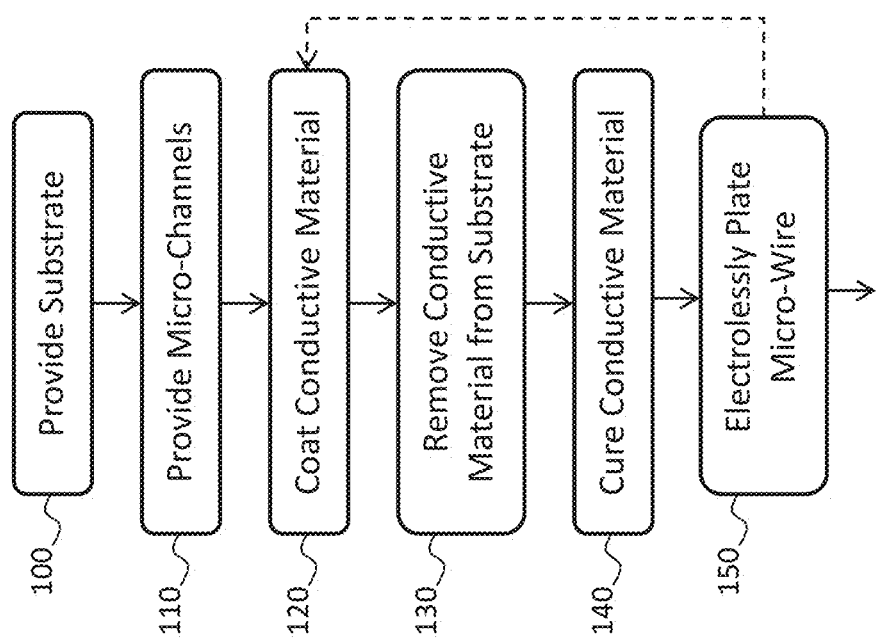

Referring to the successive cross sections of FIGS. 6-12 and the corresponding flow diagrams of FIGS. 13 and 14, a method according to the present invention of making the thin-film multi-layer micro-wire structure 5 includes providing the substrate 10 having the substrate surface 12 (FIG. 6) in step 100. Micro-channels 60 are then provided in the substrate 10 or the layer 20 in step 110. Referring for the moment to an embodiment of step 110 illustrated in FIG. 14, a curable layer 24 having a layer surface 22 is coated on the substrate surface 12 of the substrate 10 (FIG. 7) in step 200 and then imprinted in step 210 and cured in step 220 to form a cured layer 26 with the micro-channels 60 on the substrate 10 (FIG. 8). In this embodiment, the cured layer 26 is equivalent to the layer 20 in the previous Figures. Referring back to FIG. 13, conductive material, in this case a curable conductive ink 30, is coated on the layer surface 22 of the cured layer 26 on the substrate 10 and in the micro-channels 60 in step 120 (FIG. 9). The curable conductive ink 30 is removed from the layer surface 22 of the cured layer 26 on the substrate 10 in step 130 (FIG. 10) leaving the curable conductive ink 30 in the micro-channels 60. Referring to FIG. 11, ultra-violet radiation 70 is used to cure the curable conductive ink 30 (FIG. 10) to form cured conductive ink 32 in the micro-channels 60 in the cured layer 26 on the substrate 10 in step 140. In this embodiment, the cured conductive ink 32 is equivalent to the micro-wires 50 in the previous Figures. In step 150, referring to FIG. 12, the micro-wires 50 in the micro-channels 60 of the cured layer 26 on substrate 10 are electrolessly plated to form the plated layer 40, the thin-film multi-layer micro-wire 55, and the thin-film multi-layer micro-wire structure 5. As illustrated in FIG. 13, the plated layer 40 and the layer surface 22 are optionally coated with the conductive material in step 120 and the process of FIGS. 9-12 repeated as many times as desired to form the structures illustrated in FIG. 4 or 5. Note that although FIG. 5 only illustrates two micro-wires 50, 54 and two plated layers 40, 44, steps 120 to 150 of FIG. 13 can be repeated as many times as desired to form a thin-film multi-layer micro-wire structure 5 having more than two micro-wires 50 or plated layers 40. In various embodiments, the last step is step 140 (corresponding to FIG. 4) or step 150 (corresponding to FIG. 5).

Therefore, according to an embodiment of the present invention, a method of making the thin-film multi-layer micro-wire structure 5 includes providing the substrate 10 having the substrate surface 12, providing the layer 20 on the substrate surface 12 or as part of the substrate 10, the layer 20 having a layer surface 22 and one or more micro-channels 60 formed in the layer 20, each micro-channel 60 having a width less than or equal to 20 microns. A conductive material is coated over the layer surface 22 and in the micro-channels 60, the conductive material including silver nano-particles 90 and having a percent ratio of silver that is greater than or equal to 40% by weight. Excess coated conductive material is removed from the layer surface 22 but not the micro-channels 60 and the conductive material in the micro-channels 60 is cured to form the electrically conductive micro-wire 50 in each micro-channel 60. The electrically conductive micro-wire 50 is located only within each micro-channel 60 and has a width less than or equal to 20 microns and a depth less than or equal to 20 microns. Each micro-wire 50 is electrolessly plated to form the plated layer 40 located at least partially within each micro-channel 60 between the micro-wire 50 and the layer surface 22 in electrical contact with the micro-wire 50. The plated layer 40 has a thickness less than a thickness of the micro-wire 50 so that the micro-wire 50 and the plated layer 40 form the thin-film multi-layer micro-wire 55.

Figure 15:
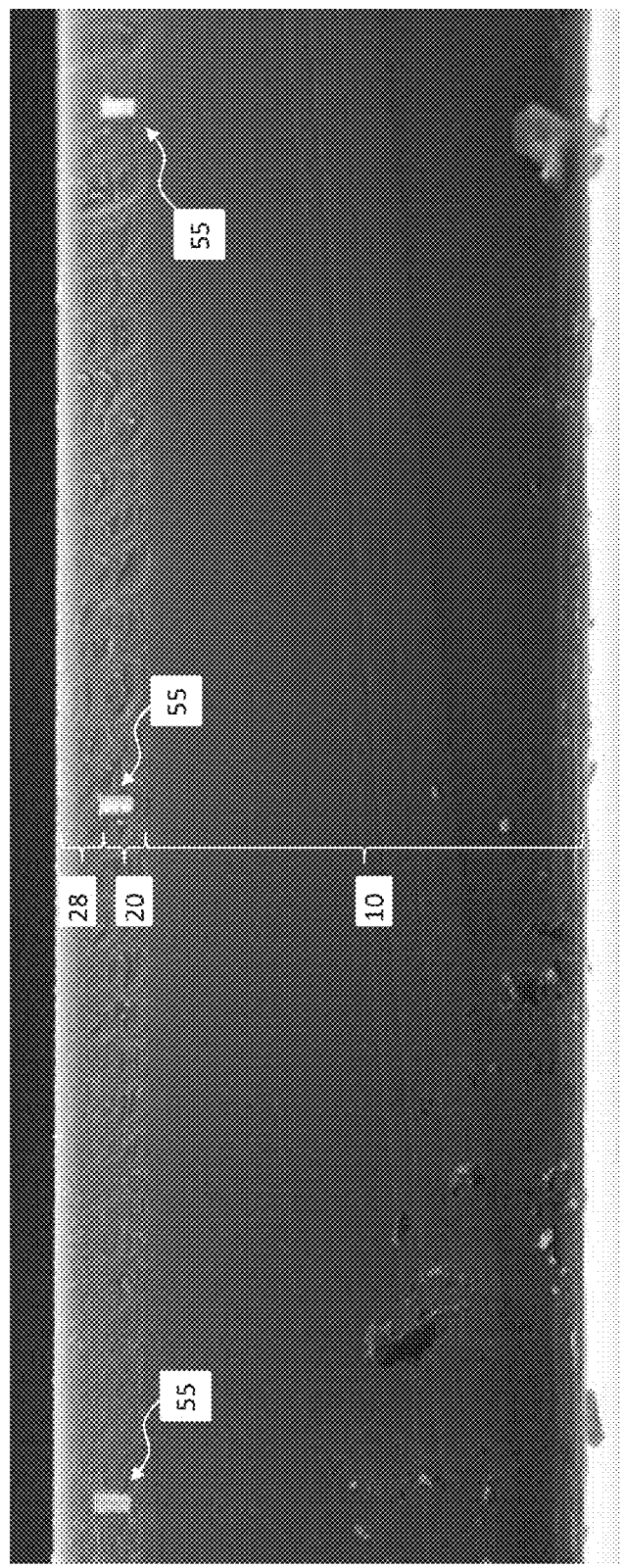
FIG. 15 is a cross section of an experimental thin-film multi-layer micro-wire structure of the present invention.
Figure 16:
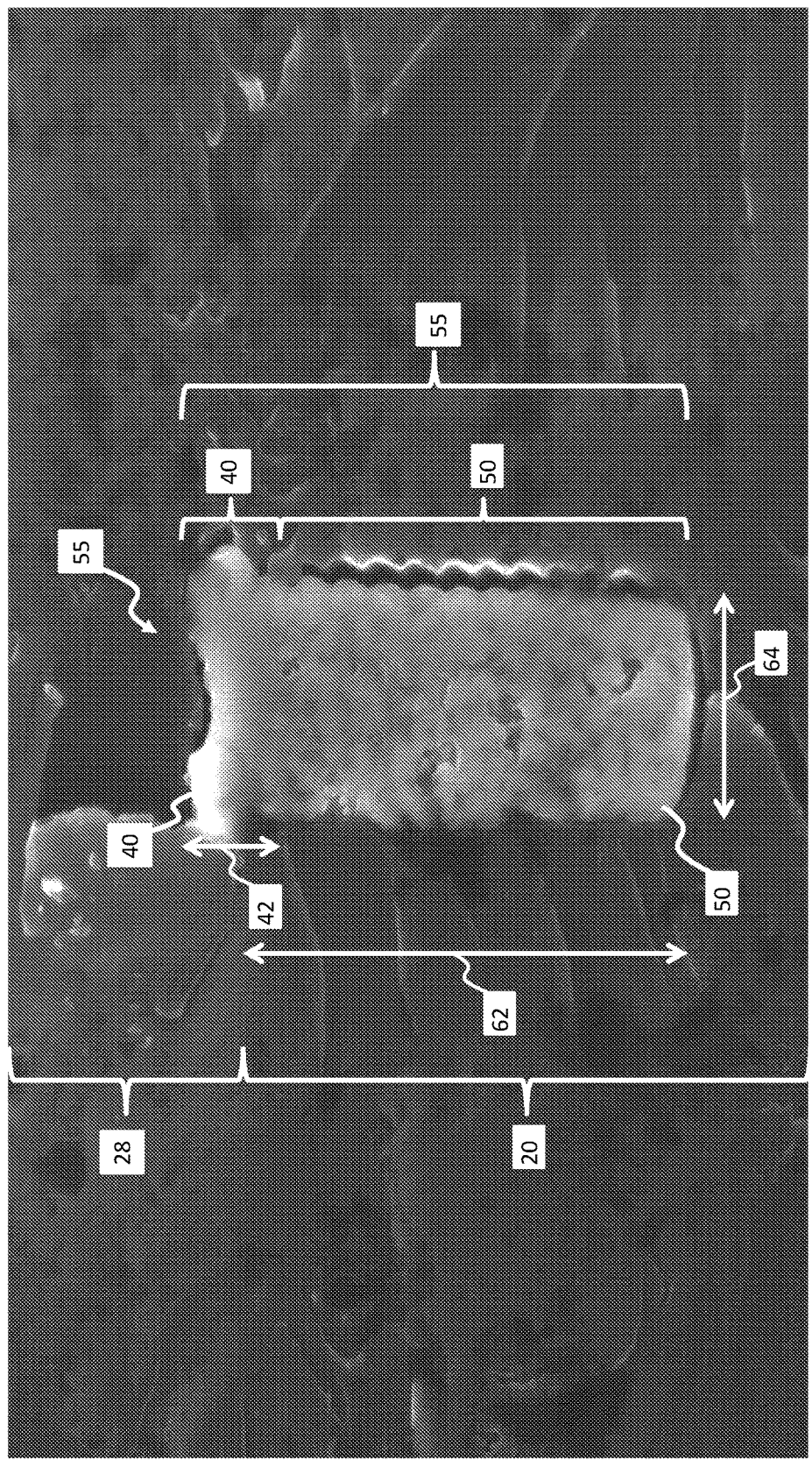
FIGS. 16 and 17 are higher magnification cross sections of one of the thin-film multi-layer micro-wires of FIG. 15.
Figure 17:
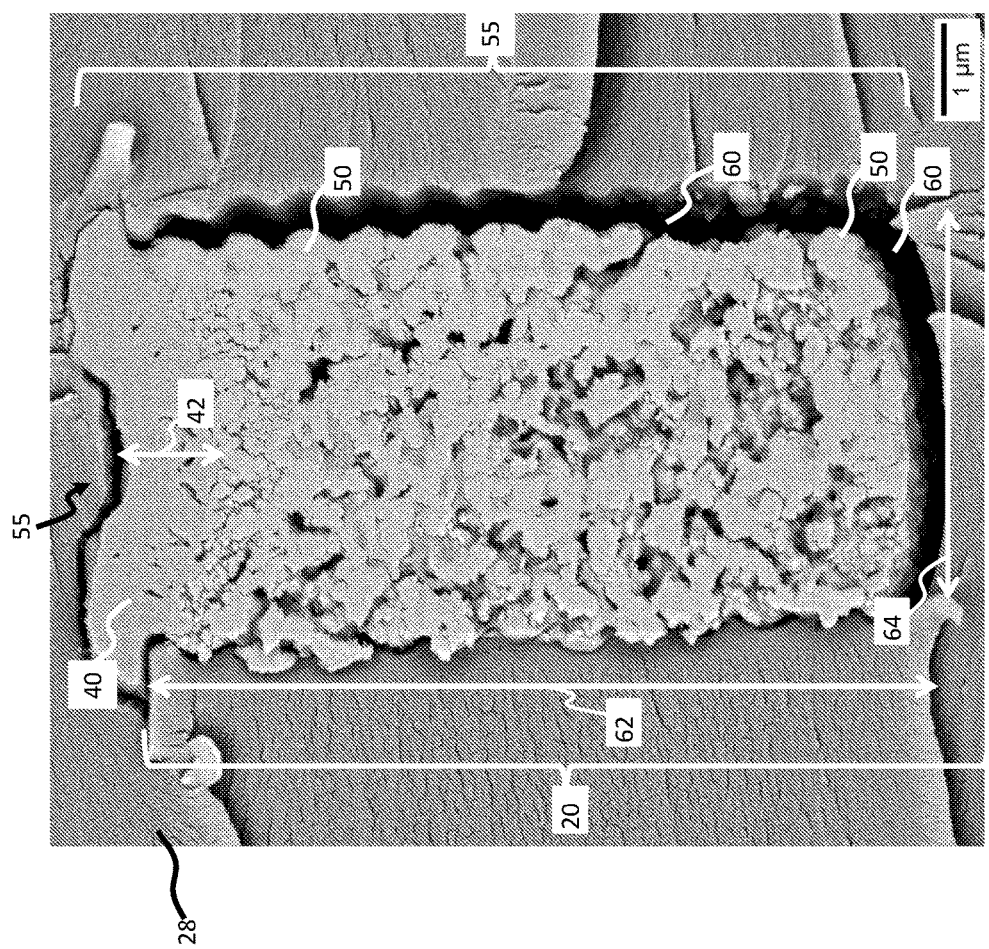

Referring to FIG. 15, a micro-graph of the thin-film multi-layer micro-wire structure 5 of the present invention includes three thin-film multi-layer micro-wires 55 spaced apart by approximately 200 microns formed in the layer 20 on the substrate 10. A polymer laminate layer 28 protects the three thin-film multi-layer micro-wires 55. In the higher magnification micro-graphs of FIGS. 16 and 17, the plated layer 40, made of copper, is distinguishable from the silver nano-particles 90 (not indicated separately) making up the micro-wire 50 in the layer 20. The plated layer 40 and the micro-wire 50 form the thin-film multi-layer micro-wire 55. The micro-channel width 64 of the micro-channel 60 is approximately four microns, the micro-channel depth 62 is approximately twelve microns, and the plated layer thickness 42 is slightly more than one micron. The thin-film multi-layer micro-wire 55 is protected by the polymer laminate layer 28. The thin-film multi-layer micro-wire structure 5 of the present invention illustrated in FIGS. 15, 16, and 17 are made according to the methods described above.

In an embodiment, each micro-wire 50 is formed with the micro-wire segments (e.g. 56, 58 in FIG. 3) having the electrically open micro-gaps 80 between the micro-wire segments 56, 58. In another embodiment, the electrically open micro-gaps 80 are formed with a micro-gap length 82 that is less than the width of the micro-channel 60 in which the micro-wire 50 is formed or alternatively is formed having a micro-gap length 82 less than one micron.

Such a method of the present invention can further include electrolessly plating each micro-wire segment 56, 58 to form a plated conductive bridge 46 in each micro-gap 80 to electrically connect the micro-wire segments 56, 58 and electrolessly plating each micro-wire 50 so that the thickness of the plated layer 40 is less than one half the thickness of the micro-wire 50. In other embodiments, the method can further include providing the layer surface 22 with a surface energy of 50 dynes/cm or greater or a water contact angle of greater than 60 degrees or providing the layer surface 22 and the micro-channel 60 with the same surface energy.

In another embodiment, the method further includes providing conductive material coated on the layer surface 22 and micro-channels 60 with a percent ratio of silver that is greater than or equal to 50%.

In a further embodiment of a method of the present invention, the conductive material is a first conductive material and the method further includes locating a second conductive material over the layer surface 22 and over the plated layer 40 in each micro-channel 60 after each micro-wire 50 is electrolessly plated. The second conductive material includes silver nano-particles 90 and has a percent ratio of silver that is greater than or equal to 40% by weight. The coated second material is removed from the layer surface 22 but not the micro-channels 60 and is cured in the micro-channels 60 to form a cured material. In an embodiment, the cured material is a light-absorbing material. In another embodiment, the micro-wire 50 is a first micro-wire 50 and the cured material is an electrically conductive second micro-wire 54 within each micro-channel 60. The second micro-wire 54 is in electrical contact with the plated layer 40. In yet another embodiment, the plated layer 40 is a first plated layer 40 and the method further includes electrolessly plating each second micro-wire 54 to form a second plated layer 44 in each micro-channel 60. The second plated layer 44 is in electrical contact with the second micro-wire 54. The second plated layer 44 can have a thickness that is less than a thickness of the second micro-wire 54 or the first micro-wire 50.

Another embodiment of a method of the present invention further includes forming each micro-wire 50 with first and second micro-wire segments 56, 58 having electrically open micro-gaps 80 between the micro-wire segments 56, 58 in first locations within the micro-channel 60, forming each second micro-wire 54 with micro-wire segments 56, 58 having electrically open second micro-gaps 84 between the micro-wire segments 56, 58 in second locations within the micro-channel 60 different from the first locations. A further embodiment further includes forming each first micro-wire 50 with micro-wire segments 56, 58 having different conductivities and wherein electrolessly plating each micro-wire segment 56, 58 reduces the conductivity variability of the micro-wire segments 56, 58 or the micro-wires 50 or forming each micro-wire 50 to have a thickness of one micron or more.

In yet another embodiment of a method of the present invention, providing the layer 20 with micro-channels 60 formed on the layer surface 22 further includes locating a curable layer on the layer surface 22, imprinting one or more micro-channels 60 in the curable layer 20, and curing the curable layer to form a cured layer 20 having one or more imprinted micro-channels 60.

In an additional embodiment, a method of making a thin-film multi-layer micro-wire structure 5 of the present invention further includes locating a curable material in the micro-channel 60 and curing the curable material to form a cured material in each micro-channel 60 in contact with the plated layer 40 on a side of the plated layer 40 opposite the micro-wire 50. The method can further include electrolessly plating the second micro-wire 54 to form a second plated layer 44 within each micro-channel 60 between the second micro-wire 54 and the layer surface 22 in electrical contact with the second micro-wire 54. The second plated layer 44 has a thickness less than a thickness of the second micro-wire 54 so that the first and second micro-wires 50, 54 and first and second plated layers 40, 44 form the thin-film multi-layer micro-wire 55.

The steps illustrated in FIGS. 13 and 14 are suitable for roll-to-roll manufacturing and are additive in nature and are therefore amenable to low-cost manufacturing. Thus, the present invention provides a thin-film multi-layer micro-wire structure 5 having improved conductivity, flexibility, transparency, reduced breaks and variability in electrical conductivity, and reduced manufacturing costs. The thin-film multi-layer micro-wire 55 can usefully form an antenna, at least a portion of an RFID, a bus line, an electrode, at least a portion of an electrode in a touch sensor, a conductor in a single-sided capacitive touch screen, or a portion of a conductor in a bus or electrical connection wire in a thin-film electronic device. The thin-film multi-layer micro-wire 55 provides additional advantages in applications requiring very long electrical conductors in comparison to the conductor width or thickness or in applications requiring only a few, only two, or only one conductor. In various embodiments, the substrate 10 is an element of a display, for example a cover or substrate of a display, or is affixed to a display.

Figure 18:
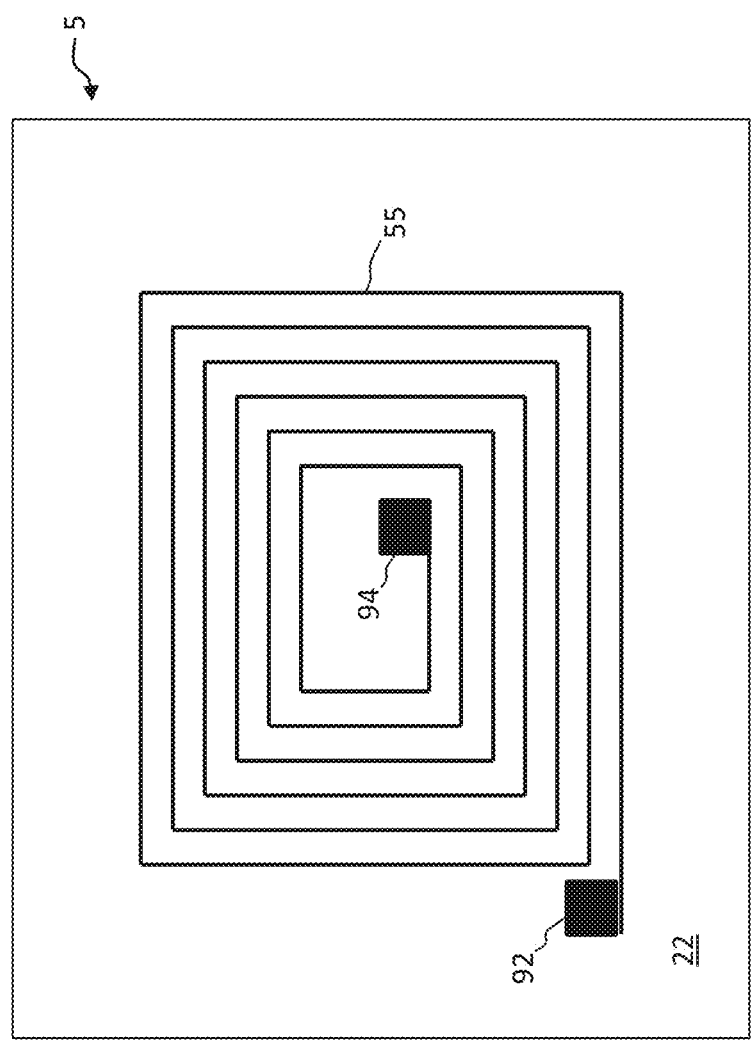
FIG. 18 is a plan view of a spiral thin-film multi-layer micro-wire structure according to an embodiment of the present invention.

In one useful embodiment of the present invention illustrated in FIG. 18, the thin-film multi-layer micro-wire structure 5 includes the thin-film multi-layer micro-wire 55 arranged in a spiral arrangement with a first terminal connection 92 at one end of the thin-film multi-layer micro-wire 55 and a second terminal connection 94 at the other end of the thin-film multi-layer micro-wire 55. In various embodiments, the spiral arrangement is nearly rectangular, as shown, nearly square, curved, or nearly circular. Electrical connections are provided at each of the first and second terminal connections 92, 94 to operate the thin-film multi-layer micro-wire structure 5, for example as an antenna. In an embodiment, thin-film multi-layer micro-wire 55 has a narrow width, for example less than 10 microns, 5 microns, two microns, or one micron and cannot be distinguished by the unaided human visual system and is therefore apparently transparent with a transparency defined by the ratio of the surface area of the thin-film multi-layer micro-wire 55 and the surface area of the layer surface 22. The thin-film multi-layer micro-wire 55 has a length greater than 0.25 m, 0.5 m, 1 m, 1.5 m, or 2 m. Thus, it is important that the likelihood of electrical opens per length of the thin-film multi-layer micro-wire 55 due to the manufacturing process or in use is very low so that manufacturing yields and electrical performance of the thin-film multi-layer micro-wire 55 are excellent.

Prior-art micro-wire structures do not address the presence of micro-gaps 80 in the micro-wires 50 and thus do not teach or motivate the thin-film multi-layer micro-wire structure 5 of the present invention. The use of a plated layer 40 that is thinner than the micro-wire 50, that is contained by the micro-channel 60 to reduce the thin-film multi-layer micro-wire 55 width, that is formed on a thin-film micro-wire 50, that relies to a greater extent upon the conductivity of the micro-wire 50 and hence has a greater proportion of highly conductive nano-particles than a conventional seed layer, and that uses plated layers 40 between multiple layers of micro-wires 50 is not found in the prior art. Therefore, the methods described herein usefully provide thin-film multi-layer micro-wire structures 5 having reduced manufacturing costs, improved conductivity and robustness to mechanical and electrical failure, improved optical characteristics such as transparency, and more consistent and improved electrical performance.

According to embodiments of the present invention, the thin-film multi-layer micro-wires 55 of the present invention are operated by electrically connecting them to electrical devices that provide electrical voltage, current, or power, for example with a controller. Suitable controllers for providing electricity to electrical conductors are well known, for example integrated circuit controllers.

According to various embodiments of the present invention, the substrate 10 is any material on which a layer 20 is formed or that is a layer 20. The substrate 10 is a rigid or a flexible substrate 10 made of, for example, a glass, metal, plastic, or polymer material, can be transparent, and can have opposing substantially parallel and extensive surfaces. The substrates 10 can include a dielectric material useful for capacitive touch screens and can have a wide variety of thicknesses, for example 10 microns, 50 microns, 100 microns, 1 mm, or more. In various embodiments of the present invention, substrates 10 are provided as a separate structure or are coated on another underlying substrate, for example by coating a polymer substrate layer on an underlying glass substrate.

In various embodiments the substrate 10 is an element of other devices, for example the cover or substrate of a display, a substrate, cover, or dielectric layer of a touch screen, or a substrate of an RFID device. In an embodiment, the substrate 10 of the present invention is large enough for a user to directly interact therewith, for example using an implement such as a stylus or using a finger or hand. Methods are known in the art for providing suitable surfaces on which to coat or otherwise form layers. In a useful embodiment, the substrate 10 is substantially transparent, for example having a transparency of greater than 90%, 80%, 70%, or 50% in the visible range of electromagnetic radiation.

Electrically conductive micro-wires 50 and methods of the present invention are useful for making electrical conductors and buses for transparent micro-wire electrodes and electrical conductors in general, for example as used in electrical buses. A variety of micro-wire patterns are used and the present invention is not limited to any one pattern. Thin-film multi-layer micro-wires 55 are spaced apart, form separate electrical conductors, or intersect to form a mesh electrical conductor on, in, or above the substrate 10. Micro-channels 60 can be identical or have different sizes, aspect ratios, or shapes. Similarly, thin-film multi-layer micro-wires 55 can be identical or have different sizes, aspect ratios, or shapes. Thin-film multi-layer micro-wires 55 can be straight or curved.

The micro-channel 60 is a groove, trench, or channel formed on or in the layer 20 extending from the layer surface 22 of the layer 20 and having a cross-sectional width for example less than 20 microns, 10 microns, 5 microns, 4 microns, 3 microns, 2 microns, 1 micron, or 0.5 microns, or less. In an embodiment, the cross-sectional depth of a micro-channel 60 is comparable to its width. Micro-channels 60 can have a rectangular cross section. Other cross-sectional shapes, for example trapezoids, are known and are included in the present invention. The width or depth of a layer is measured in cross section.

Imprinted layers 20 useful in the present invention can include a cured polymer material with cross-linking agents that are sensitive to heat or radiation, for example infra-red, visible light, or ultra-violet radiation. The polymer material is a curable material applied in a liquid form that hardens when the cross-linking agents are activated. When a molding device, such as an imprinting stamp having an inverse micro-channel structure is applied to liquid curable material and the cross-linking agents in the curable material are activated, the liquid curable material in the curable layer is hardened into a cured layer with imprinted micro-channels. The liquid curable materials can include a surfactant to assist in controlling coating. Materials, tools, and methods are known for embossing coated liquid curable materials to form cured layers.

The cured layer 26 is a layer of curable material that has been cured. For example, the cured layer 26 is formed of a curable material coated or otherwise deposited on the substrate surface 12 to form a curable layer 24 and then cured to form the cured layer 26 on the substrate surface 12. The coated curable material is considered herein to be the curable layer 24 before it is cured and the cured layer 26 after it is cured. Cured layer 26 is also referred to as the layer 20. Similarly, a cured electrical conductor is an electrical conductor formed by locating a curable material in the micro-channel 60 and curing the curable material to form the thin-film multi-layer micro-wire 55 in the micro-channel 60. As used herein, curing refers to changing the properties of a material by processing the material in some fashion, for example by heating, drying, irradiating the material, or exposing the material to a chemical, energetic particles, gases, or liquids.

The curable layer 24 is deposited as a single layer in a single step using coating methods known in the art, such as curtain coating. In an alternative embodiment, the curable layer 24 is deposited as multiple sub-layers using multi-layer deposition methods known in the art, such as multi-layer slot coating, repeated curtain coatings, or multi-layer extrusion coating. In yet another embodiment, the curable layer 24 includes multiple sub-layers formed in different, separate steps, for example with a multi-layer extrusion, curtain coating, or slot coating machine as is known in the coating arts.

Curable inks useful in the present invention are known and can include conductive inks having electrically conductive nano-particles, such as the silver nano-particles 90. In an embodiment, the electrically conductive nano-particles 90 are metallic or have an electrically conductive shell. The electrically conductive nano-particles 90 can be silver, can be a silver alloy, or can include silver. In various embodiments, cured inks can include metal particles 90, for example nano-particles 90. The metal particles 90 are sintered to form a metallic electrical conductor. The metal nano-particles 90 are silver or a silver alloy. Cured inks can include light-absorbing materials such as carbon black, a dye, or a pigment.

Curable inks provided in a liquid form are deposited or located in the micro-channels 60 and cured, for example by heating or exposure to radiation such as infra-red radiation, visible light, or ultra-violet radiation. The curable ink hardens to form the cured conductive ink that makes up the first or second micro-wires 50, 54. For example, a curable conductive ink with conductive nano-particles 90 is located within the micro-channels 60 and cured by heating or sintering to agglomerate or weld the nano-particles 90 together, thereby forming electrically conductive first or second micro-wires 50, 54. Materials, tools, and methods are known for coating liquid curable inks to form micro-wires 50.

In an embodiment, a curable ink can include conductive nano-particles 90 in a liquid carrier (for example an aqueous solution including surfactants that reduce flocculation of metal particles, humectants, thickeners, adhesives or other active chemicals). The liquid carrier is located in the micro-channels 60 and heated or dried to remove the liquid carrier or treated with hydrochloric acid, leaving a porous assemblage of conductive particles 90 that are agglomerated or sintered to form a porous electrical conductor in the layer 20. Thus, in an embodiment, curable inks are processed to change their material compositions, for example the conductive particles 90 in a liquid carrier are not electrically conductive but after processing form an assemblage that is electrically conductive.

Once deposited, the conductive inks are cured, for example by heating. The curing process drives out the liquid carrier and sinters the metal particles 90 to form a metallic electrical conductor that is the micro-wire 50. Conductive inks are known in the art and are commercially available. In any of these cases, conductive inks or other conducting materials are conductive after they are cured and any needed processing completed. Deposited materials are not necessarily electrically conductive before patterning or before curing. As used herein, a conductive ink is a material that is electrically conductive after any final processing is completed and the conductive ink is not necessarily electrically conductive at any other point in the micro-wire formation process.

In various embodiments of the present invention, the micro-channels 60 or the micro-wires 50 have a width less than or equal to 10 microns, 5 microns, 4 microns, 3 microns, 2 microns, or 1 micron. In an example and non-limiting embodiment of the present invention, each micro-wire 50 is from 10 to 15 microns wide, from 5 to 10 microns wide, or from 5 microns to one micron wide. In an embodiment, the micro-wires 50 are solid; in another embodiment, the micro-wires 50 are porous.

The present invention is useful in a wide variety of electronic devices. Such devices can include, for example, photovoltaic devices, OLED displays and lighting, LCD displays, plasma displays, inorganic LED displays and lighting, electro-phoretic displays, electro-wetting displays, dimming mirrors, smart windows, transparent radio antennae, transparent heaters and other touch-screen devices such as capacitive touch screen devices.

The invention has been described in detail with particular reference to certain embodiments thereof, but it will be understood that variations and modifications can be effected within the spirit and scope of the invention.

PARTS LIST

B cross section line
C cross section line
5 thin-film multi-layer micro-wire structure
10 substrate
12 substrate surface
20 layer
22 layer surface
24 curable layer
26 cured layer
28 polymer laminate layer
30 curable conductive ink
32 cured conductive ink
40 plated layer/first plated layer
42 plated layer thickness
44 second plated layer
46 plated conductive bridge
50 micro-wire/first micro-wire
52 micro-wire thickness
54 second micro-wire/cured material
55 thin-film multi-layer micro-wire
56 first micro-wire segment
58 second micro-wire segment
60 micro-channel
62 micro-channel depth
64 micro-channel width
66 micro-channel length
70 radiation
80 micro-gap/first micro-gap
82 micro-gap length
84 second micro-gap
90 particle
92 first terminal connection
94 second terminal connection
100 provide substrate step
110 provide micro-channels step
120 coat conductive material step
130 remove conductive material from substrate step
140 cure conductive material step
150 electrolessly plate micro-wire step
200 coat curable layer step
210 imprint curable layer step
220 cure curable layer step

The invention claimed is:

1. A method of making a thin-film multi-layer micro-wire structure, comprising:
providing a substrate having a substrate surface;
providing a layer on the substrate surface or as part of the substrate, the layer having a layer surface and one or more micro-channels formed in the layer, each micro-channel having a width less than or equal to 20 microns;
coating a conductive material over the layer surface and in the one or more micro-channels, the conductive material including silver nano-particles;
removing the coated conductive material from the layer surface but not the one or more micro-channels;
curing the conductive material in the one or more micro-channels to form an electrically conductive micro-wire located only within each micro-channel, the micro-wire having a width less than or equal to 20 microns and a depth less than or equal to 20 microns, wherein the micro-wire has a percent ratio of silver that is greater than or equal to 40% by weight, each micro-wire includes micro-wire segments having one or more electrically open micro-gaps between the micro-wire segments; and
electrolessly plating each micro-wire to form a plated layer located at least partially within each micro-channel between the micro-wire and the layer surface, the plated layer being in electrical contact with the micro-wire and having a thickness less than a thickness of the micro-wire so that the micro-wire and plated layer form the thin-film multi-layer micro-wire structure.

2. The method of claim 1, further including forming the one or more electrically open micro-gaps with a length less than the width of each micro-channel.

3. The method of claim 1, further including forming the one or more electrically open micro-gaps between the micro-wire segments with a length less than one micron.

4. The method of claim 1, further including electrolessly plating each micro-wire segment to form a plated conductive bridge in each micro-gap to electrically connect the micro-wire segments.

5. The method of claim 1, further including electrolessly plating each micro-wire so that the thickness of the plated layer is less than one half the thickness of the corresponding micro-wire.

6. The method of claim 1, further including providing the layer surface with a surface energy of 50 dynes/cm or greater or a water contact angle of greater than 60 degrees.

7. The method of claim 1, further including providing the layer surface and the one or more micro-channels with the same surface energy.

8. The method of claim 1, further including providing the first conductive material with a percent ratio of silver that is greater than or equal to 50%.

9. The method of claim 1, further including forming each micro-wire to have a thickness of one micron or more.

10. The method of claim 1 wherein the thin-film multi-layer micro-wire structure forms an antenna, at least a portion of an RFID, a bus line, an electrode, or at least a portion of an electrode in a touch sensor.

11. The method of claim 10, wherein the electroless plating further includes using a solution that includes copper, a copper alloy, tin, or a tin alloy in a sufficient amount to permit the antenna to radiate and receive electromagnetic signals.

12. The method of claim 1, wherein providing a layer with one or more micro-channels formed therein on the substrate surface further includes locating a curable layer on the substrate surface, imprinting one or more micro-channels in the curable layer, and curing the curable layer to form a cured layer having one or more imprinted micro-channels.

13. A method of making a thin-film multi-layer micro-wire structure, comprising:
providing a substrate having a substrate surface;

providing a layer on the substrate surface or as part of the substrate, the layer having a layer surface and one or more micro-channels formed in the layer, each micro-channel having a width less than or equal to 20 microns;

coating a first conductive material over the layer surface and in the one or more micro-channels, the first conductive material including silver nano-particles;

removing the coated first conductive material from the layer surface but not the one or more micro-channels;

curing the first conductive material in the one or more micro-channels to form an electrically conductive first micro-wire located only within each micro-channel, the first micro-wire having a width less than or equal to 20 microns and a depth less than or equal to 20 microns, wherein the first micro-wire has a percent ratio of silver that is greater than or equal to 40% by weight; and electrolessly plating each first micro-wire to form a plated layer located only within each micro-channel, the plated layer being in electrical contact with the first micro-wire and having a thickness less than a thickness of the first micro-wire;

locating a second conductive material over the layer surface and over the plated layer in each micro-channel after each first micro-wire is electrolessly plated, the second conductive material including silver nano-particles;

removing the second conductive material from the layer surface but not the one or more micro-channels;

curing the second conductive material in the one or more micro-channels to form a cured second material, wherein the cured second material has a percent ratio of silver that is greater than or equal to 40% by weight.

14. The method of claim 13, wherein the cured second material is a light-absorbing material.

15. The method of claim 13, wherein the cured second material is an electrically conductive second micro-wire located only within each micro-channel, the second micro-wire being in electrical contact with the plated layer.

16. The method of claim 15, wherein the plated layer is a first plated layer and further including electrolessly plating each second micro-wire to form a second plated layer located at least partially within each micro-channel between the second micro-wire and the layer surface, the second plated layer being in electrical contact with the second micro-wire.

17. The method of claim 16, wherein the second plated layer has a thickness less than a thickness of the second micro-wire or the first micro-wire.

18. The method of claim 15, further including forming each first micro-wire with first micro-wire segments having one or more electrically open first micro-gaps between the first micro-wire segments in first location(s) within each micro-channel, forming each second micro-wire with second micro-wire segments having one or more electrically open second micro-gaps between the second micro-wire segments in second location(s) within each micro-channel different from the first location(s).

19. The method of claim 15, further including forming each first micro-wire with micro-wire segments having different conductivities and wherein electrolessly plating each micro-wire segment reduces the conductivity variability of the micro-wire segments.

20. A method of making a thin-film multi-layer micro-wire structure, comprising providing a substrate having a substrate surface;

locating a curable layer on the substrate surface, imprinting one or more micro-channels in the curable layer, and curing the curable layer to form a cured layer having one or more imprinted micro-channels, each micro-channel having a width less than or equal to 20 microns, the cured layer having a layer surface;

coating a conductive material over the layer surface and in the one or more micro-channels, the conductive material including silver nano-particles;

removing the coated conductive material from the layer surface but not the one or more micro-channels;

curing the conductive material in the one or more micro-channels to form an electrically conductive first micro-wire located only within each micro-channel, the first micro-wire having a width less than or equal to 20 microns and a depth less than or equal to 20 microns, wherein the first micro-wire has a percent ratio of silver that is greater than or equal to 40% by weight;

electrolessly plating each first micro-wire to form a plated layer located at least partially within each micro-channel between the first micro-wire and the layer surface, the plated layer being in contact with the first micro-wire and having a thickness less than a thickness of the first micro-wire; and locating a curable material in the one or more micro-channels and curing the curable material to form a cured material in each micro-channel, the cured material being in contact with the plated layer on a side of the plated layer opposite the first micro-wire.

21. The method of claim 20, wherein the cured material within each of the one or more micro-channels is light-absorbing or is an electrically conductive second micro-wire that includes silver nano-particles and has a percent ratio of silver that is greater than or equal to 40% by weight.

22. The method of claim 21, wherein the plated layer is a first plated layer and further including electrolessly plating each second micro-wire to form a second plated layer within each micro-channel between the second micro-wire and the layer surface, the second plated layer being in electrical contact with the second micro-wire and having a thickness less than a thickness of the second micro-wire so that the first and second micro-wires and first and second plated layers form the thin-film multi-layer micro-wire structure.

23. The method of claim 21, wherein each first micro-wire includes first micro-wire segments having one or more electrically open first micro-gaps between the micro-wire segments in first location(s) within each micro-channel and each second micro-wire includes second micro-wire segments separated by one or more electrically open second micro-gaps between the second micro-wire segments in second location(s) within each micro-channel different from the first location(s).

* * * * *